United States Patent
Ohsawa

(10) Patent No.: US 6,882,008 B1
(45) Date of Patent: Apr. 19, 2005

(54) SEMICONDUCTOR INTEGRATED CIRCUIT DEVICE

(75) Inventor: Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/779,621

(22) Filed: Feb. 18, 2004

(30) Foreign Application Priority Data

Oct. 30, 2003 (JP) ...................................... 2003-370696

(51) Int. Cl.[7] .............................................. H01L 27/01
(52) U.S. Cl. ....................... 257/347; 257/313; 257/314; 257/348
(58) Field of Search ................................. 257/313, 314, 257/347, 348

(56) References Cited

U.S. PATENT DOCUMENTS

| | | |
|---|---|---|
| 6,538,916 B1 | 3/2003 | Ohsawa |
| 6,617,651 B1 | 9/2003 | Ohsawa |
| 6,621,725 B1 | 9/2003 | Ohsawa |
| 6,825,524 B1 * | 11/2004 | Ikehashi et al. ............ 257/314 |
| 2004/0058506 A1 * | 3/2004 | Fukuzumi ................... 438/422 |

FOREIGN PATENT DOCUMENTS

JP          2002-246571         8/2002

OTHER PUBLICATIONS

Charles Kuo, et al., "A Capacitorless Double–Gate DRAM Cell Design for High Density Applications", IEDM Tech. Digest, Dec. 2002, pp. 843–846.

* cited by examiner

*Primary Examiner*—George Eckert
*Assistant Examiner*—N. Drew Richards
(74) *Attorney, Agent, or Firm*—Oblon, Spivak, McClelland, Maier & Neustadt, P.C.

(57) ABSTRACT

A semiconductor integrated circuit device comprises a semiconductor substrate; an insulating layer formed on the semiconductor substrate; a semiconductor layer insulated from the semiconductor substrate by the insulating layer; source regions of a first conduction type and drain regions of the first conduction type both formed in the semiconductor layer; body regions of a second conduction type formed in the semiconductor layer between the source regions and the drain regions to store data by accumulating or releasing an electric charge; word lines formed on the body regions in electrical isolation from the body regions to extend in a first direction; bit lines connected to the drain regions and extending in a direction different from the first direction; and buried wirings formed in the insulating layer in electrical isolation from the semiconductor substrate and the semiconductor layer, said buried wirings extending in parallel with the bit lines.

13 Claims, 11 Drawing Sheets

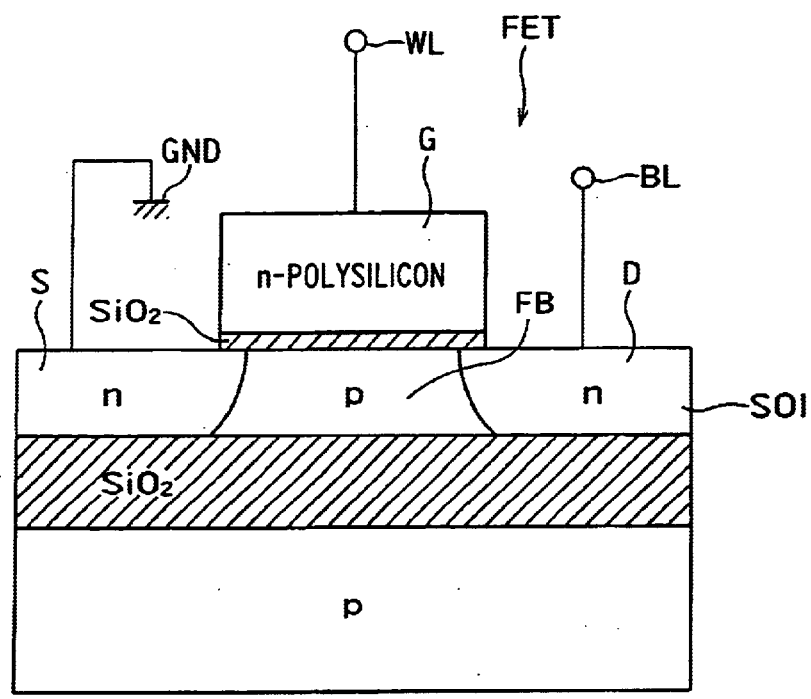
FIG. 1 2  PRIOR ART
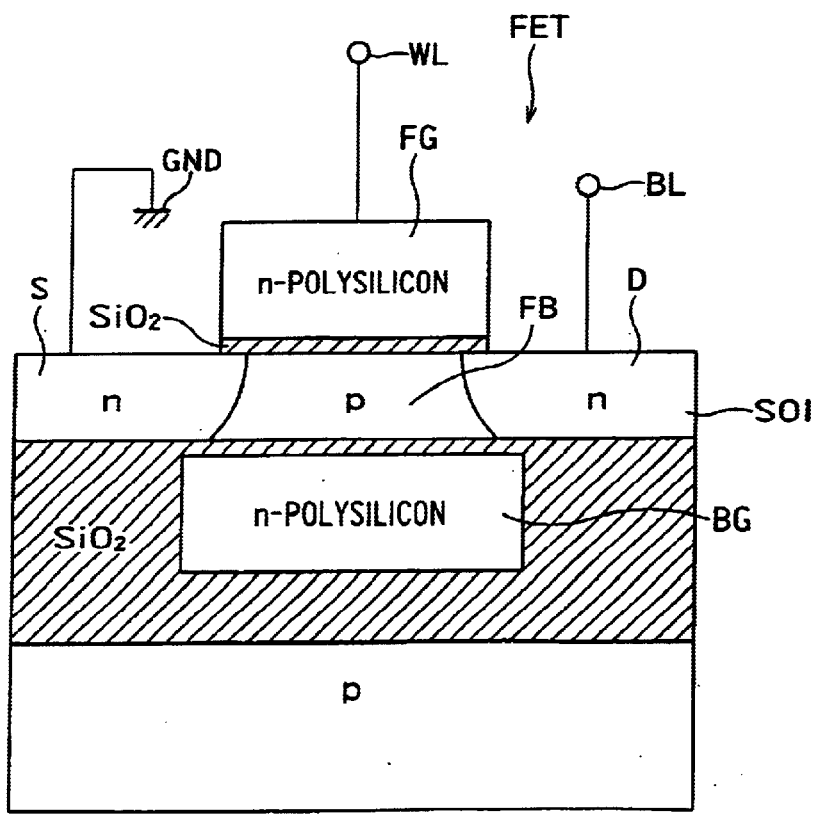
FIG. 1 3  PRIOR ART

SEMICONDUCTOR INTEGRATED CIRCUIT DEVICE

CROSS-REFERENCE TO RELATED APPLICATIONS

This application is based upon and claims the benefit of priority from the prior Japanese Patent Application No. 2003-370696, filed on Oct. 30, 2003, the entire contents of which are incorporated herein by reference.

BACKGROUND OF THE INVENTION

1. Field of the Invention

The present invention relates to a semiconductor integrated circuit device.

2. Related Background Art

For years, 1T-1C (1 transistor 1 capacitor) DRAM (dynamic random access memory) devices have been manufactured. 1T-1C DRAMs having memory cells reduced in design rule to smaller than 0.1 µm are difficult to manufacture.

On this account, a DRAM having FBCs (floating body cells) as shown in FIG. 12 has been proposed (Japanese Patent Laid-open Publication No. JP2002-246571). FBC comprises a FET (field effect transistor) formed in SOI. The gate G of the FET is connected to a word line WL, the drain D is connected to b bit line BL, and the source S is connected to GND. The floating body FB functions as the data storage node.

FBC changes the number of carriers stored in the floating body FB and thereby changes the potential of the floating body FB. Data is stored by a change of threshold voltage of FET caused by the body effect.

For writing data "1" in FBC, both the word line WL and the bit line BL are raised to high potentials to bias FET toward the saturated state. Thereby, impact ionization is induced, and holes are stored in the floating body FB. The state with a larger number of holes stored in the floating body FB is regarded as data "1".

For writing data "0" in FBC, the bit line BL is lowered to a negative potential, and the pn junction between the p-type body and the n-type body is thereby biased in the forward direction. As a result, the holes heretofore stored in the floating body FE are released to the bit line BL.

FIG. 13 is a cross-sectional view of another DRAM having FBCs (see "A Capacitorless Double-Gate DRAM Cell Design for High Density Applications" by C. Kuo, Tsu-Jae King and Chenming Hu, IEDM Tech. Digest, pp. 843–846, December 2002). This DRAM includes back gate electrodes BG in addition to front gate electrodes FG.

For writing data "0" in a floating body FE of this DRAM, both the floating gate electrode FG and the back gate electrode BG are set to high potentials whereas the potential barrier between the floating body FB and the source S is lowered. As a result, the holes heretofore stored in the floating body FE are released to the source S.

According to the DRAM shown in FIG. 12, the bit line BL is lowered to a negative potential to write data "0" in a selected cell, data of a non-selected cell connected to the same bit line BL and storing data "1" may be undesirably erased. This is generally called "0" disturbance.

In order to prevent "0" disturbance, the junction between the potential of the floating body FD of the non-selected cell and its drain D must be held in the reverse-biased or a weakly forward-biased condition (0.7 V or less). Therefore, it is necessary to lower the potential of the floating body FD of the non-selected cell to a sufficiently low negative potential by lowering the word line WL of the non-selected cell to an amply low negative potential.

According to the DRAM shown in FIG. 13, since the front gate electrode FG and the back gate electrode BG are parallel to each other, all cells connected to the activated word line WL are undesirably rewritten to data "0". Therefore, upon refreshing operation and writing operation, the sense amplifier latches data of all cells connected to the word line WL before "0" is written (S1). After that, data "0" is once written in all cells (S2), and data "1" is rewritten only in those cells, having stored "1" just before "0" is written, according to the data latched in the sense amplifier (S3). Thus, the DRAM of this type needs steps S1 through S3. Therefore, the DRAM shown in FIG. 13 needs a long cycle time for the refreshing and writing operations and needs sense amplifier circuits for individual bit lines BL.

The DRAM including sense amplifier circuits for individual bit line BL decreases the cell efficiency and increases in chip size because the sense amplifier circuits occupy a large area. This means that FBC will lose its advantage of having a smaller cell size than 1T-1C type DRAM.

It is therefore desired to provide a semiconductor integrated circuit device reduced in refreshing cycle time and writing cycle time and reduced in chip size without influences of "0" disturbance.

SUMMARY OF THE INVENTION

A semiconductor integrated circuit device comprises a semiconductor substrate; an insulating layer formed on the semiconductor substrate; a semiconductor layer insulated from the semiconductor substrate by the insulating layer; source regions of a first conduction type and drain regions of the first conduction type both formed in the semiconductor layer; body regions of a second conduction type formed in the semiconductor layer between the source regions and the drain regions to store data by accumulating or releasing an electric charge; word lines formed on the body regions in electrical isolation from the body regions to extend in a first direction; bit lines connected to the drain regions and extending in a direction different from the first direction; and buried wirings formed in the insulating layer in electrical isolation from the semiconductor substrate and the semiconductor layer, said buried wirings extending in parallel with the bit lines.

BRIEF DESCRIPTION OF THE DRAWINGS

FIG. 12 is a cross-sectional view of conventional DRAM having FBCs; and

FIG. 13 is a cross-sectional view of conventional DRAM having FBCs.

DETAILED DESCRIPTION OF THE INVENTION

Some embodiments of the invention will now be explained below with reference to the drawings. The invention, however, is not limited to these embodiments. In these embodiments, even when using n-type semiconductors instead of p-type semiconductors while using p-type semiconductors instead of n-type semiconductors, the same effects are assured.

In these embodiments, a back gate of a double-gate SOI transistor is provided in parallel to the bit line. Thereby, the above-mentioned problems are resolved.

(First Embodiment)

Figure 1:
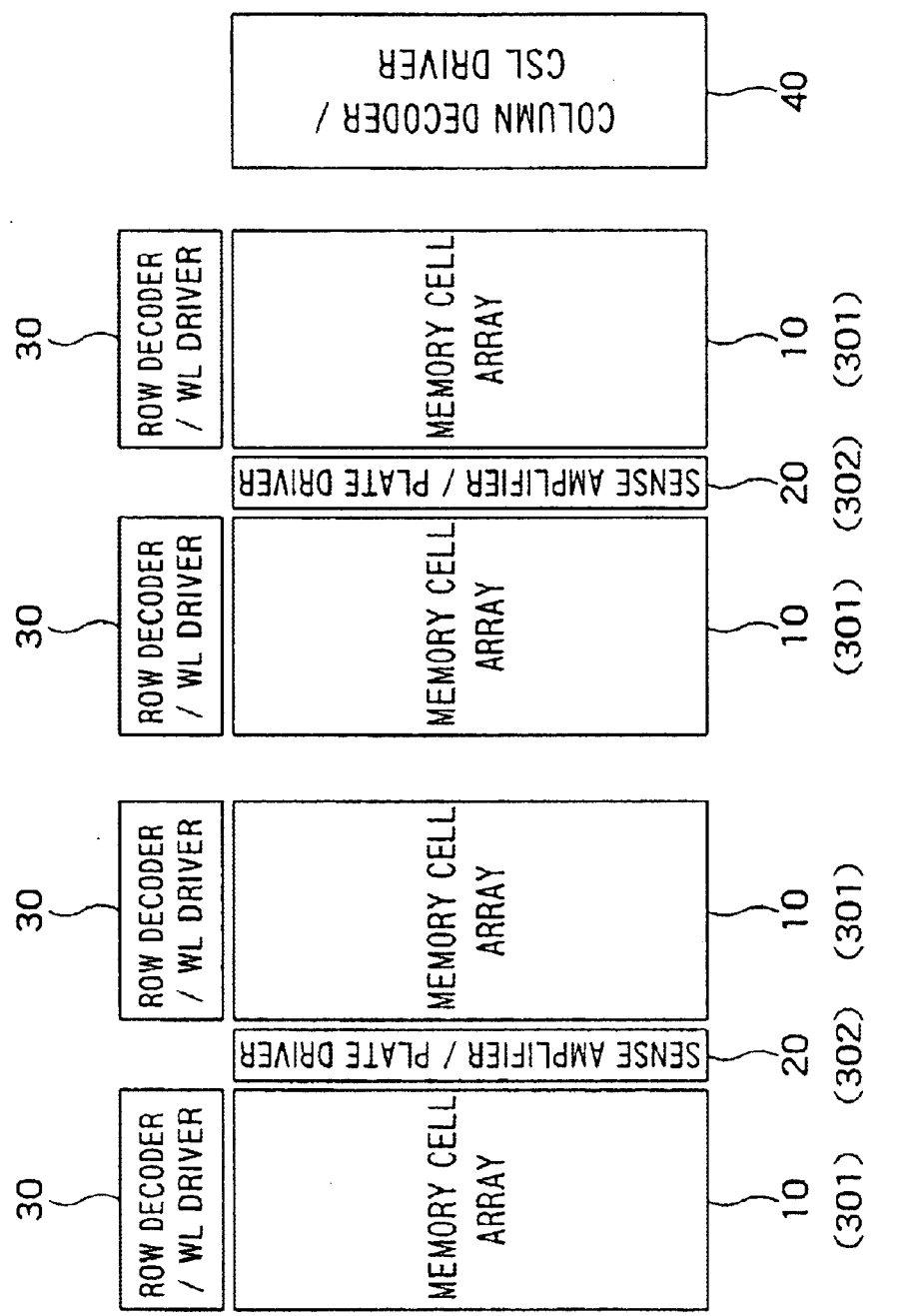
FIG. 1 is a block diagram showing a memory portion of DRAM 100 according to the first embodiment of the invention.

FIG. 1 is a block diagram showing a memory portion of DRAM 100 according to the first embodiment of the invention. The memory portion includes memory cell arrays 10, sense amplifier/plate driver portions (herein below simply called SA/PDs) 20, row decoders combined with WL drivers (herein below simply called row decoders) 30, and a column decoder combined with CSL (column select line) driver (herein below simply called column decoder) 40.

Each memory cell 10 comprises memory cells having a matrix arrangement of FBCs. The plurality of memory cell arrays 10 are aligned side by side. The SA/PDs 20 are provided in every other spaces between memory cell arrays 10. One SA/PD 20 is connected to memory cell arrays 10 at both sides thereof and can detect and latch data in these memory cell arrays 10. In addition, the SA/PD 20 can selectively control the potential of the plate lines PL shown in FIG. 2 and can drive the selected plate line PL.

Each row decoder 30 is associated with each memory cell array 10, and can select a word line in the memory cell array 10. The column decoder 40 is associated with a group of memory cell arrays 10 in side-by-side arrangement, and can select a bit line in the memory cell arrays 10.

Figure 2:
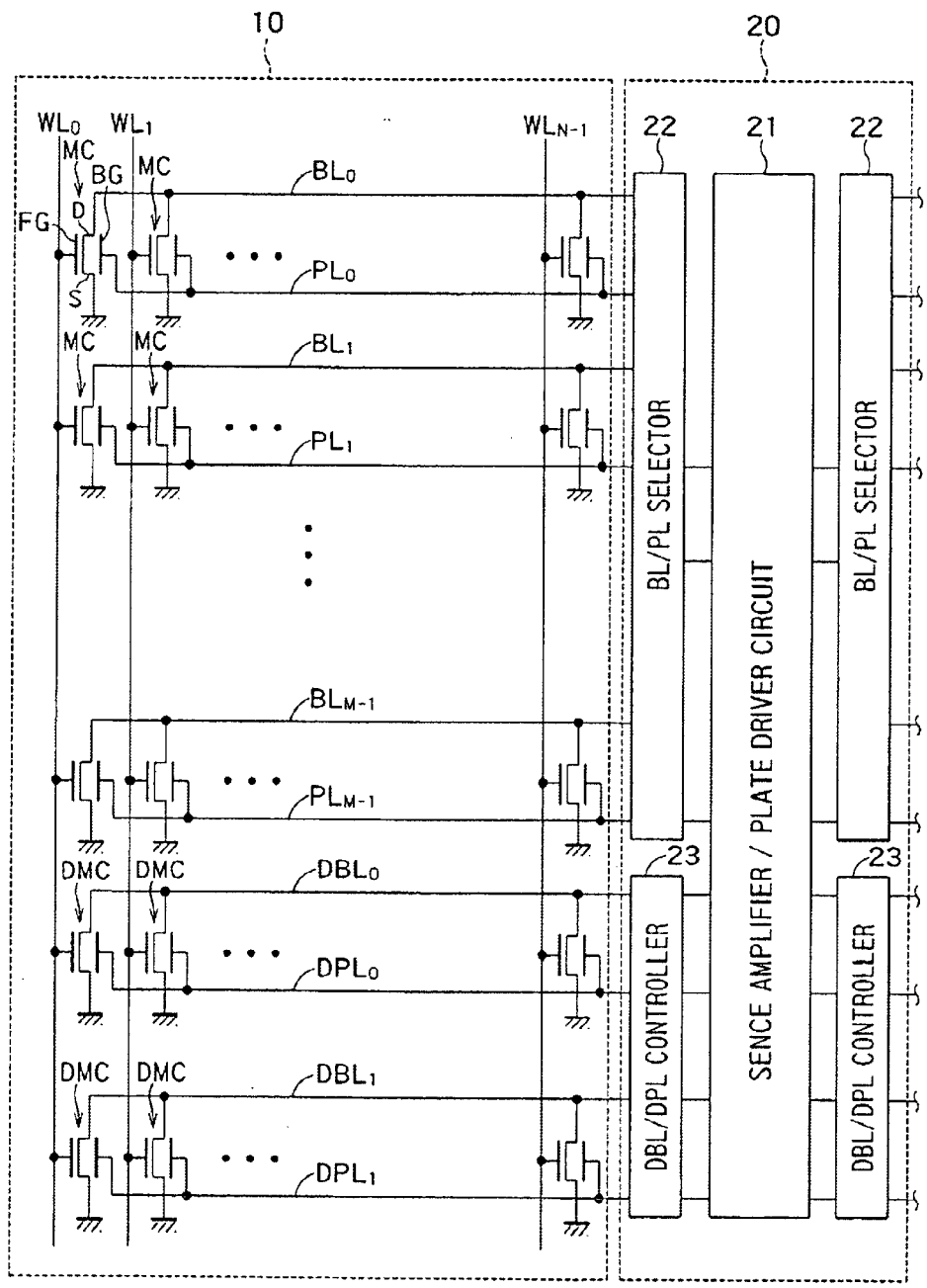
FIG. 2 is a circuit diagram of a memory cell array 10 and SA/PD 20 in DRAM 100.

FIG. 2 is a circuit diagram of one memory cell array 10 and one SA/PD 20 in DRAM 100. At the right of the SA/PD 20, another memory cell array 10 is connected, although not shown. In the memory cell array 10, N word lines $WL_0 \sim WL_{N-1}$, M bit lines $BL_0 \sim BL_{M-1}$, and M plate lines $PL_0 \sim PL_{M-1}$ are provided. Furthermore, memory cells MC are provided in the memory cell array 10 at the crossing points of the word lines $WL_0 \sim WL_{N-1}$ and bit lines $BL_0 \sim BL_{M-1}$. That is, one memory cell array 10 has N*M memory cells MC. Alternatively, L sets of N*M memory cells may be aligned in the direction of the word lines to include N*M*L memory cells in one memory cell array 10.

Figure 3:
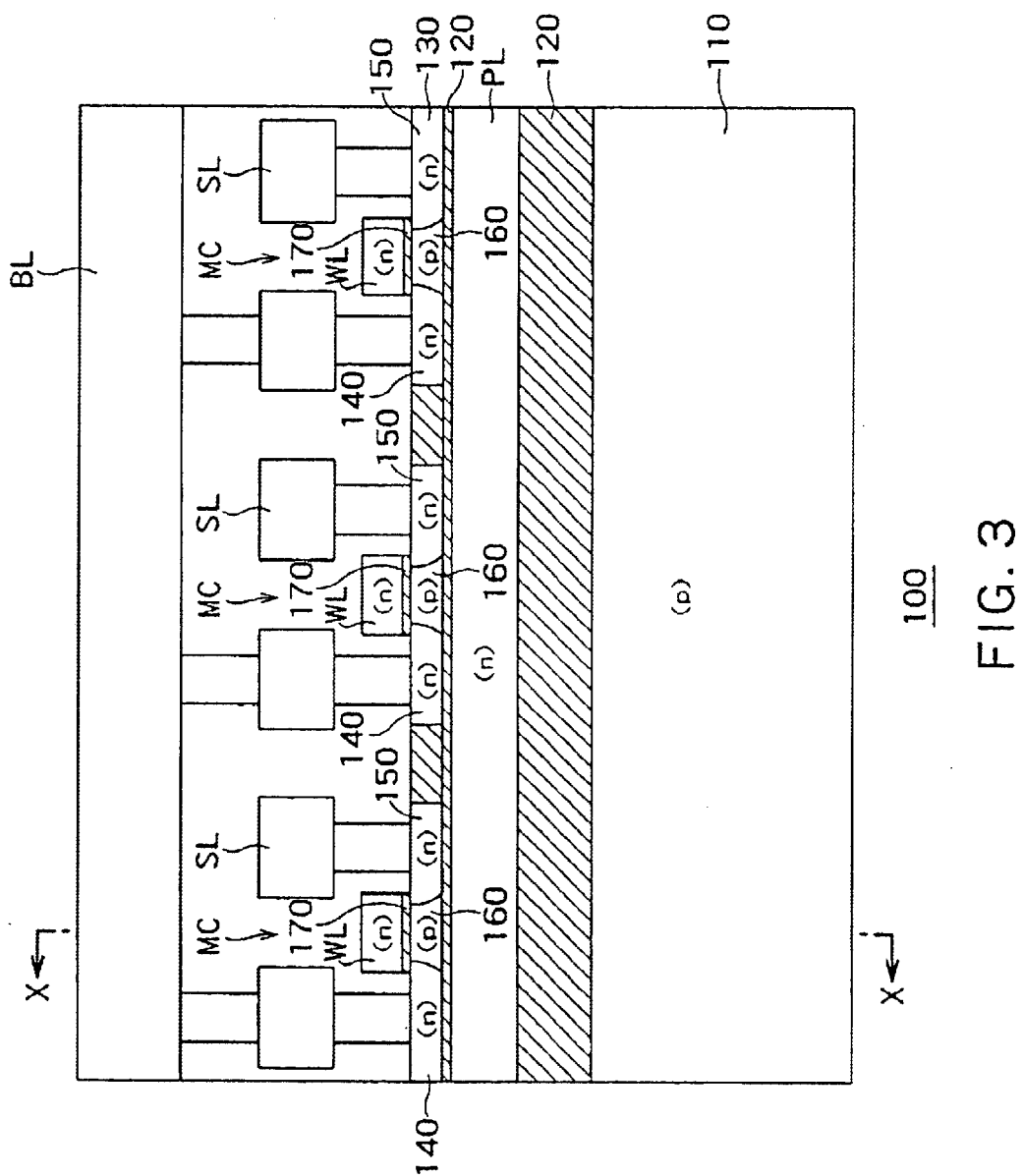
FIG. 3 is a cross-sectional view of the memory portion of DRAM 100 taken along a bit line BL.

Each memory cell MC is a double-gate SOI transistor formed on SOI (silicon-on-insulator) to include a forward gate FG and a back gate BG as shown in FIG. 3.

Each of the word lines $WL_0 \sim WL_{N-1}$ is connected to individual forward gates FG of memory cells MC of each row in the memory cell. Each of the bit lines $BL_0 \sim BL_{M-1}$ is connected to individual drains D of memory cells MC of each column in the memory cell array 10. Each of the plate lines $PL_0 \sim PL_{M-1}$ is connected to individual back gates BG of memory cells of each column in the memory cell array 10. Individual plate lines $PL_0 \sim PL_{M-1}$ are associated with individual bit lines $BL_0 \sim BL_{M-1}$. Preferably, the plate lines $PL_0 \sim PL_{M-1}$ extend in parallel with the bit lines $BL_0 \sim BL_{M-1}$.

The word lines $WL_0 \sim WL_{N-1}$ are connected to a row decoder 30 (see FIG. 1), respectively. The bit lines $BL_0 \sim BL_{M-1}$ and the plate lines $PL_0 \sim PL_{M-1}$ are connected to the SA/PD 20, respectively.

The SA/PD 20 includes sense amplifier/plate driver circuits 21 and BL (bit line)/PL (plate line) selectors 22. The BP/PL selectors 22 select a pair of bit line and plate line, and the pair of bit line and plate line selected by the BL/PL selectors 22 can be exclusively connected to the sense amplifier/plate driver circuits 21. On the other hand, the WL driver in the row decoder 30 selects one of word lines $WL_0 \sim WL_{N-1}$ and can drive the word line. Thus, a memory cell MC at the crossing point of the selected pair of bit line and plate line with the selected word line can be selected.

The memory cell array 10 further includes dummy memory cells DMC. Forward gates FG of the dummy memory cells DMC are connected to word lines, and dummy bit lines $DBL_0$ or $DBL_1$ are connected to the drains of the dummy memory cells DMC. Back gates BG of the dummy memory cells DMC are connected to dummy plate lines $DPL_0$ or $DPL_1$.

The SA/PD 20 further includes DBL/DPL controllers 23 connected to the dummy bit lines $DBL_0$, $DBL_1$, and dummy plate lines $DPL_0$, $DPL_1$.

Dummy memory cells DMC are used when associated sense amplifiers SA detect data of memory cells. For example, dummy memory cells DMC connected to the dummy bit line $DBL_0$ store data "0", and dummy memory cells DMC connected to the dummy bit line $DBL_1$ store data "1". Upon detection of the data, the sense amplifier SA adds currents of these dummy memory cells DMC and reduces the current to a half by means of a current mirror circuit (not shown). The sense amplifier SA compares the half current value with the current in each memory cell MC and thereby detects data "1" or data "0" of the memory cells MC.

As such, the sense amplifier/plate driver circuit 21 can detect data of memory cells MC by means of the bit lines BL and the word lines WL. Regarding the data detecting method, the invention is not limited to the above-explained method, but may employ any appropriate one of known methods.

FIG. 3 is a cross-sectional view of the memory portion of DRAM 100 taken along a bit line BL. The DRAM 100 includes a p-type semiconductor substrate 110, silicon oxide film 120, SOI layer 130, n-type drain regions 140, n-type source regions 150, p-type body regions 160, word lines WL, bit lines BL, n-type plate lines PL and source lines SL.

The silicon oxide film 120 is formed on the semiconductor substrate 110. The plate lines PL are formed in the silicon oxide film 120 and isolated from the semiconductor substrate 110 and the SOI layer 130. The plate lines PL extend in parallel to the bit lines BL. The SOI layer 130 overlies the silicon oxide film 120 and is isolated from the semiconductor substrate 110 and the silicon oxide film 120.

The drain regions 140 and the source regions 150 are formed in the SOI layer 130. The body regions 160 are formed between the drain regions 140 and the source regions 150 in the SOI layer 130.

A gate insulating film 170 lies on the body regions 160, and the word lines WL lie on the gate insulating film 170.

Thereby, the word lines WL are insulated from the body regions 160. The word lines WL extend in the direction vertical to the sheet plane of FIG. 3. The bit lines BL are electrically connected to the drain regions 140, and extend across the word lines WL.

Figure 4:
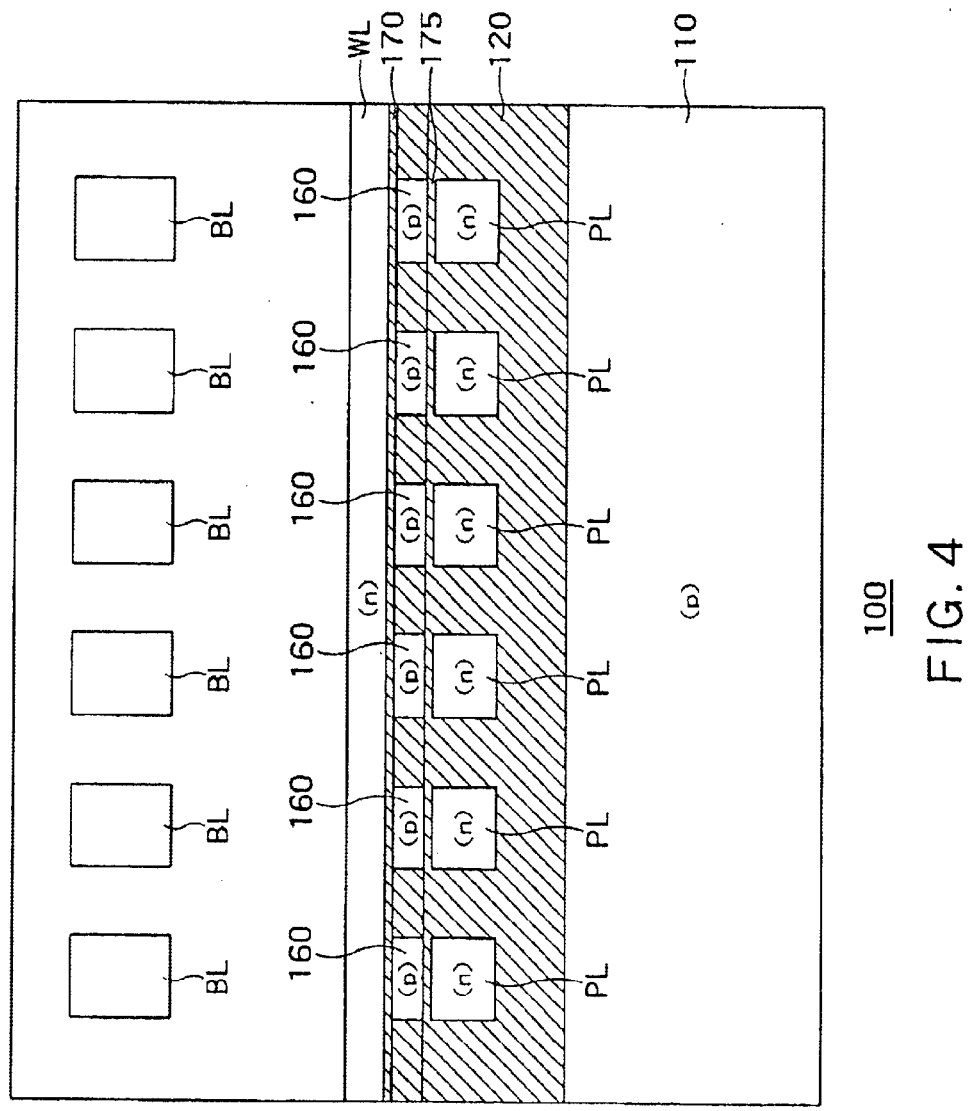
FIG. 4 is a cross-sectional view of the memory portion of DRAM 100 taken along a word line WL.

FIG. 4 is a cross-sectional view of the memory portion of DRAM 100 taken along a word line WL (along the X—X line of FIG. 3). It will be understood from FIGS. 3 and 4 that the bit lines BL and plate lines PL are associated with each other and extend in parallel. As best shown in FIG. 4, the bit line BL are aligned substantially in equal intervals. The plate lines PL are aligned in the same intervals as those of the bit lines BL.

Figure 5:
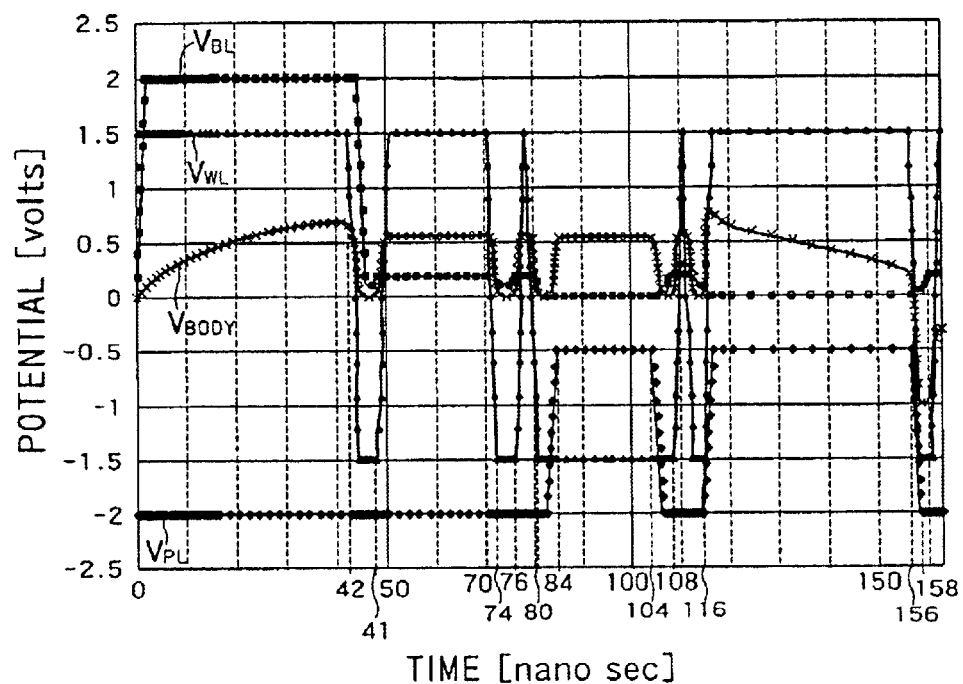
FIG. 5 is a graph showing the potential of a body region 160 controlled by potentials of the bit line BL, word line WL and plate line PL.
Figure 6:
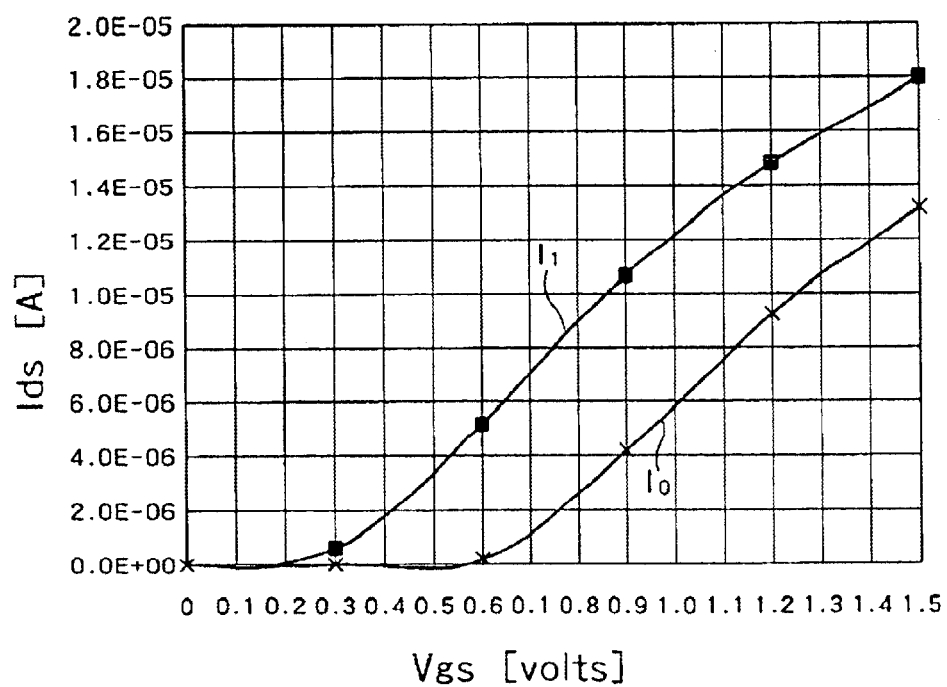
FIG. 6 is a graph showing the relation between the potential Vgs of the word line WL and the drain-to-drain current Ids while data is read out from a memory cell MC.

Next referring to FIGS. 5 and 6, operations and effects of the DRAM 100 will be explained. Graphs shown in FIGS. 5 and 6 are results of a simulation of writing "0" or "1" in the DRAM 100. The simulation was conducted under the conditions: channel length of memory cells MC: $L_{gate}$= 0.175 μm; thickness of the gate insulating film 170: $T_{oxf}$=80 angstrom; thickness of the insulating film 175 between the body regions 160 and the plate lines PL: $T_{box}$=120 angstrom, thickness of the silicon of the body regions 160: $T_{si}$=330 angstrom. The acceptor impurity concentration in the body regions 160 is constantly $1.0*10^{16}$ cm$^{-3}$. Both the word lines WL and the plate lines PL are made of n-type polysilicon having a sufficiently high impurity concentration. The word lines WL and the plate lines PL function as front gates FG and back gates BG, respectively.

The graph of FIG. 5 shows the potential of the body regions 160 controlled by respective potentials in the bit lines BL, word lines WL and plate lines PL. The abscissa indicates time (in nanosecond) and the ordinate indicates those potentials (in Volt). Potentials of the bit lines BL, word lines WL and plate lines PL are denoted by "$V_{BL}$", "$V_{WL}$" and "$V_{PL}$", respectively. Potential of the body regions 160 is denoted by "$B_{BODY}$".

The graph of FIG. 6 shows relations between the potential Vgs of the word line WL and the drain-to-source current Ids while data is read out from a memory cell MC.

First referring to FIG. 5, let data "1" be written in a memory cell MC. For the period from 0 nm to 42 ns, $V_{WL}$ is held in 1.5 V and the $V_{BL}$ is held in 2.0 V to bias the memory cell MC to the saturated sate. As a result, impact ionization occurs in the body region 160, and the potential of the body region 160 gradually rises. Once the potential of the body region 160 reaches approximately 0.7 V, the current generated by holes becomes substantially equal to the forward current flowing into the pn junction between the body region 160 and the source region 150, and the potential of the body region 160 becomes substantially stationary. At that time, writing of data "1" in the memory cell MC is completed.

Next let the data "1" be maintained in the memory cell MC. After the data "1" is written in the memory cell MC, $V_{BL}$ is set to $_{0V}$ and $V_{WL}$ to −1.5 V at the point of time, 46 ns. Since $V_{WL}$ is a negative potential, holes in the body region 160 are maintained. Therefore, the memory cell MC holds data "1".

Next let $V_{WL}$ be raised to read out the data from the memory cell MC in order to examine whether or not the holes leak from the body region 160. Leakage of holes from the body region 160 is called "disturbance" herein below. For the period from about 50 ns to 70 ns, setting $V_{BL}$ to 0.2 V, and raising $V_{WL}$ from −1.5 V to 1.5 V, $V_{PL}$ is maintained in −2 V. In this sate, let the data in the body region 160 be monitored. Thus, the potential of the body region 160 is confirmed to maintain approximately 0.6V unchanged. This suggests that no disturbance has occurred. In FIG. 6, curve $I_1$ shows the relation between the word line potential Vgs and the drain current IDs at the time of reading out the data.

Again referring to FIG. 5, let the data of the memory cell MC be read out by again holding the data "1" and thereafter raising $V_{WL}$ while keeping $V_{PL}$ in −2V, for the purpose of confirming any disturbance to data "1". Referring to FIG. 6, the drain current Ids of the memory cell MC then observed overlapped the curve $I_1$. It has been confirmed from it that, even when the data is read out from the memory cell MC, the relation between the word line potential Vgs and the drain current IDs is maintained, and it has been confirmed that no disturbance occurred.

Next let it examined whether any disturbance occurs by raising the potential of the plate line PL and reading the data of the memory cell MC. For this purpose, for the period from about 84 ns to about 104 ns in FIG. 5, the potential $V_{PL}$ of the plate line PL is raised from −2 V to −5 V. $V_{WL}$ is maintained in −1.5V. In this case, the potential of the body region 160 is maintained approximately in 0.6 V unchanged. This suggests that no disturbance has occurred.

For the purpose of confirming that no disturbance occurs, the data of the memory cell MC is read out by raising the potential of the word line WL for the period from about 108 ns to about 110 ns. With reference to FIG. 6, the drain current Ids of the memory cell MC observed here also overlapped the curve $I_1$. It has been confirmed from it that, even when the potential of the plate line PL is raised while $V_{WL}$ of the word line WL is maintained in −1.5 V, the relation between the word line potential Vgs and the drain current Ids is maintained, and disturbance did not occur.

Finally, for the period from about 116 ns to about 156 ns, the potential $V_{WL}$ and the potential $V_{PL}$ are raised to 1.5 V and −0.5 V, respectively. Thereby, data "0" is written in the memory cell MC. As a result, the potential of the body region 160 decreases. The duration of time for this writing was approximately 40 nm. After the data "0" is written in the memory cell MC, it is held at the point of time, 158 ns, approximately. Thereafter, by reading out the data "0" from the memory cell MC in the period from about 160 ns to about 162 ns, the curve $I_0$ shown in FIG. 6 was obtained. It is appreciated from this result that the drain current Ids reliably decreases, and the data "0" is certainly written in the memory cell MC.

As such, if the potential of only one of the word line WL and the plate line PL is raised, the potential barrier between the body region 160 and the source region 150 does not decrease sufficiently. Therefore, holes in the body region 160 are not released to the source region 150, and the data "1" is maintained. On the other hand, if both the word line WL and the plate line PL are raised in potential, the potential barrier between the body region 160 and the source region 150 decreases sufficiently. As a results holes in the body region 160 are released to the source region 150, and the data "0" is written in the memory cell MC.

As such, when both the word line WL and the plate line PL are raised in potential, the data "0" is written in the memory cell MC (see the points of time 116 ns ~156 ns in FIG. 5). This means that the data "0" is written in the memory cell MC selected by a word line WL and a plate line PL. On the other hand, when only one of the word line WL and the plate line PL is raised in potential, the data "1" stored in the memory cell MC does not change (see the point of time 46 ns ~108 ns in FIG. 5). This means that no disturbance occurs against non-selected memory cells MC storing data "1".

In this manner, upon a refreshing operation, it is possible to select a memory cell MC having stored data "0" by means of a word line WL and a plate line PL and to write the data "0" only in that memory cell MC once again.

In the prior art shown in FIG. 13, since the forward gates FG (word lines) and the back gates BG (plate lines) are parallel, it is not possible to select a particular memory cell MC alone and write the data "0" only in the memory cell MC, and it is therefore necessary to execute three steps S1, S2 and S3 for refreshing old data and writing new data.

In contrast, in the instant embodiment of the invention, since the plate lines PL extend across the word lines WL and substantially in parallel to the bit lines BL. Therefore, it is possible to select a memory cell MC at a crossing point of a word line WL and a plate line PL to write "0" and simultaneously select a memory cell MC at a crossing point of a word line WL and a bit line BL to write the data "1". Thus, the embodiment need only one step of writing data "0" or "1" in the memory cell MC for refreshing old data and writing new data. As a result, the instant embodiment reduces the cycle time for refreshing and writing operations than the prior art.

In addition, the DRAM 100 according to the instant embodiment need not read data from all memory cells MC and latch them in the process of refreshing and writing operations. Therefore, the sense amplifier need not be provided in one-to-one association with each bit line BL, but one sense amplifier is sufficient for one memory cell array 10. As a result, in the semiconductor chip, the proportion of the area occupied by the sense amplifiers is reduced, the ratio of cell area increases, and the chip size is reduced.

Further, since this embodiment includes the word lines WL and the plate lines PL as forward gates and back gates, respectively, the problem of GIDL does not occur in this embodiment.

The duration of time for writing the data "0", that is, the duration of time where potentials of the word line WL and the plate line PL are kept high, is important. As shown in FIG. 6, at the point of time, 156 ns, where the writing of the data "0" is completed, the potential of the body region 160 is in the course of decreasing. On the other hand, continuing the writing of data "0" until the potential of the body region 160 stabilizes results in elongating the cycle time of the refreshing operation. Therefore, writing of data "0" is continued only until the potential becomes sufficiently distinctive from the potential for data "1", but not continued beyond it up to a balanced condition. Therefore, in order to prevent fluctuation of data, it is important to manage the duration of time for writing data "0".

(Second Embodiment)

Figure 7:
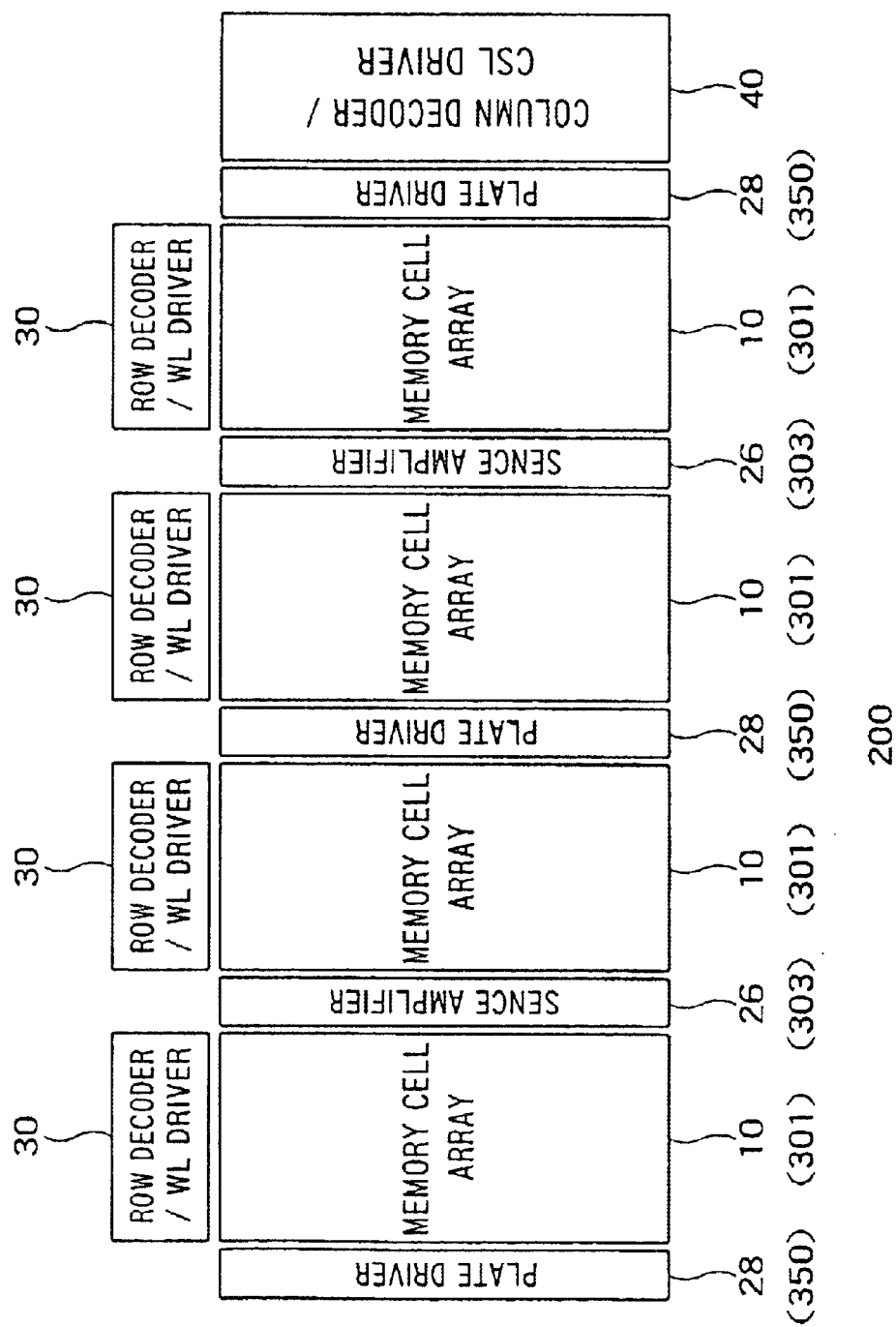
FIG. 7 is a block diagram showing a memory portion of DRAM 200 according to the second embodiment of the invention.

FIG. 7 is a block diagram showing the memory portion of DRAM 200 according to the second embodiment of the invention. In this embodiment, the sense amplifier portion 26 and the plate driver portion 28 are provided in separate locations. The other structural features of this embodiment are identical to those of the first embodiment. They are, therefore, not explained here.

The sense amplifier portion 26 is located near one side of the memory cell array 10. The plate driver portion 28 is located near the opposite side of the memory cell array 10 to be opposed to the sense amplifier portion 26 via the memory cell array 10. As such, the sense amplifier portion 26 and the plate driver portion 28 are provided to appear alternately in spaces between every two adjacent memory cell arrays 10, and they each are commonly used for two memory cell arrays 10 at both sides thereof.

Figure 8:
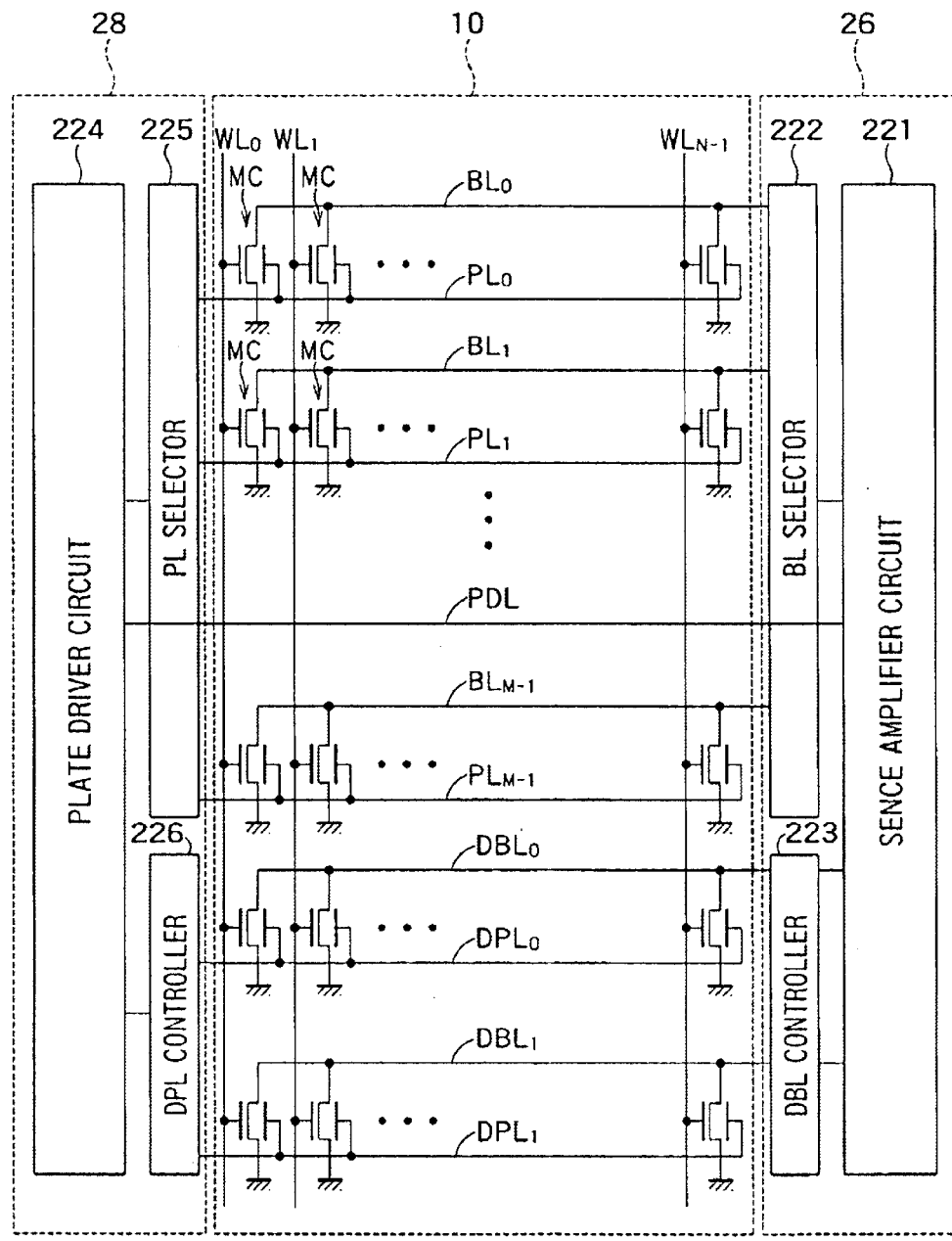
FIG. 8 is a circuit diagram of a memory cell array 10, sense amplifier 26 and plate driver 28 in DRAM 200.

FIG. 8 is a circuit diagram showing one memory cell array 10, one sense amplifier 26 and one plate driver 28. In harmony with the circuit arrangement including the sense amplifier portion 26 and the plate driver portion 28 as separate portions, the sense amplifier/plate driver circuit 21 shown in FIG. 2 are separated to a sense amplifier circuit 221 and a plate driver circuit 224 in this embodiment. Similarly, the BL/PL selector 22 shown in FIG. 2 is separated to a BL selector 222 and a PL selector 225 in this embodiment. Furthermore, the DBL/DPL selector 23 shown in FIG. 2 is separated to a DBL selector 223 and a DPL selector 226 in this embodiment. The sense amplifier circuit 221, BL selector 222 and DBL selector 223 are involved in the sense amplifier 26 whereas the plate driver circuit 224, PL selector 225 and DPL selector 226 are involved in the plate driver 28.

The sense amplifier circuit 221 and the plate driver circuit 224 are connected by a plate drive line PDL. A plate drive signal is transferred from the sense amplifier circuit 221 to the plate driver circuit 224 via the plate drive line PDL.

If data detected by the sense amplifier portion 26 is "0" in a refreshing or writing operation, the plate drive signal transfers the information to the plate driver portion 28. Thus, the plate driver portion 28 can selectively drive the plate line PL upon writing data "0".

In case of writing data "0" from outside in a writing operation, a peripheral data bus may directly transfer the information to the plate driver portion 28. In case the sense amplifier portion 26 should process both the data "1" and data "0" in a writing operation, the sense amplifier portion 26 may transfer the information of data "0" alone to the late driver portion 28 via the plate drive line PDL. Thus, the sense amplifier portion 26 can control the timing for driving the plate driver portion 28. Wiring of the plate driver line PDL can be formed from the same metal wiring layer as that of the column select line CSL, which is the top layer on the memory cell array.

A simulation of operation of the DRAM 200 results identical to the first embodiment under the same conditions. Therefore, the second embodiment has the same effects as these of the first embodiment. In addition, the second embodiment makes it easier to design the sense amplifier portion 26 and the plate driver portion 28 because they are separately positioned. Especially when the bit lines BL and the plate lines PL are arranged in a fine pitch, it is difficult from the standpoint of the circuit design to drive the bit lines BL and the plate lines PL independently from the same direction. Therefore, the second embodiment is particularly effective for a design having a fine pitch arrangement of bit lines BL and plate lines PL.

(Third Embodiment)

Figure 9:
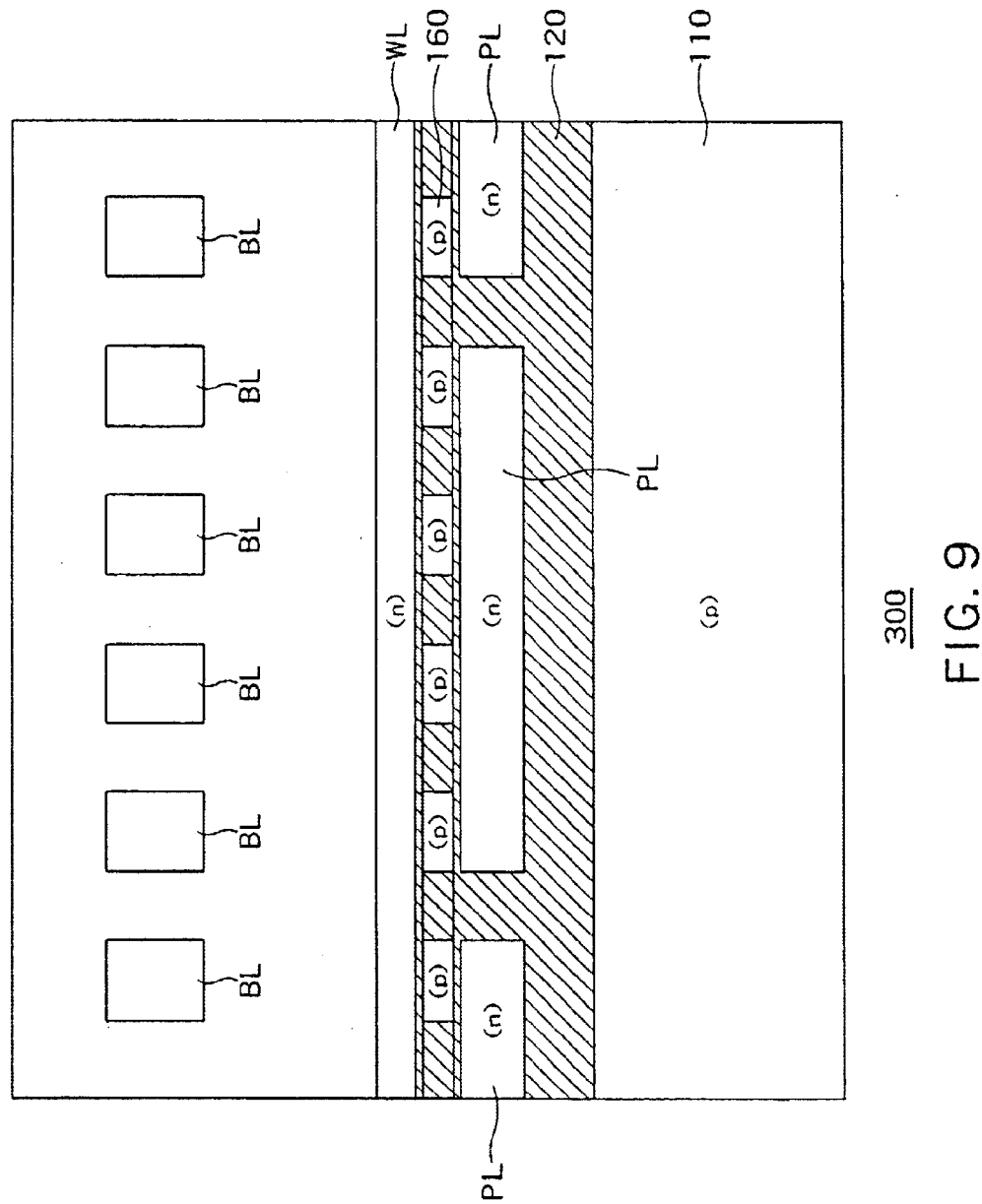
FIG. 9 is a cross-sectional view of the memory portion of DRAM 300 according to the third embodiment of the invention, taken along a word line WL.

FIG. 9 is a cross-sectional view of the memory portion of DRAM 300 according to the third embodiment of the invention, taken along a word line WL. When the DRAM 300 is cut along a BL line, it will appear identical to FIG. 3. The cross-sectional view of FIG. 9 may be same as the cross-sectional view taken along the X—X line of FIG. 3.

As shown in FIG. 9, each plate line PL in this embodiment is associated with four bit lines BL and four body regions 160. A simulation of operation of the DRAM 300 results identical to that of the first embodiment under the same conditions.

According to the instant embodiment, even when there is a difficulty in forming the plate lines PL in a fine pitch arrangement, or in forming the plate lines PL in precise alignment with the bit line BL, the plate line PL can be formed in parallel with the bit lines BL.

In this embodiment, however, if data "0" is written in a memory cell in the same manner as the first and second embodiments, a plurality of memory cells connected to bit lines BL associated with a particular plate line PL are rewritten to data "0" simultaneously.

Therefore, this embodiment needs sense amplifiers in the same number of the bit lines BL associated with one plate line PL. Then, the sense amplifiers can read and latch the data of all memory cells before writing data "0" in all memory cells and thereafter rewrite data "1" only in memory cells having stored data "1" before.

As such, the third embodiment needs a reduced number of sense amplifiers equal in number to the bit lines BL associated with one plate line PL. Therefore, the third embodiment increases the proportion of the cell area and reduces the chip size than conventional devices.

Figure 10:
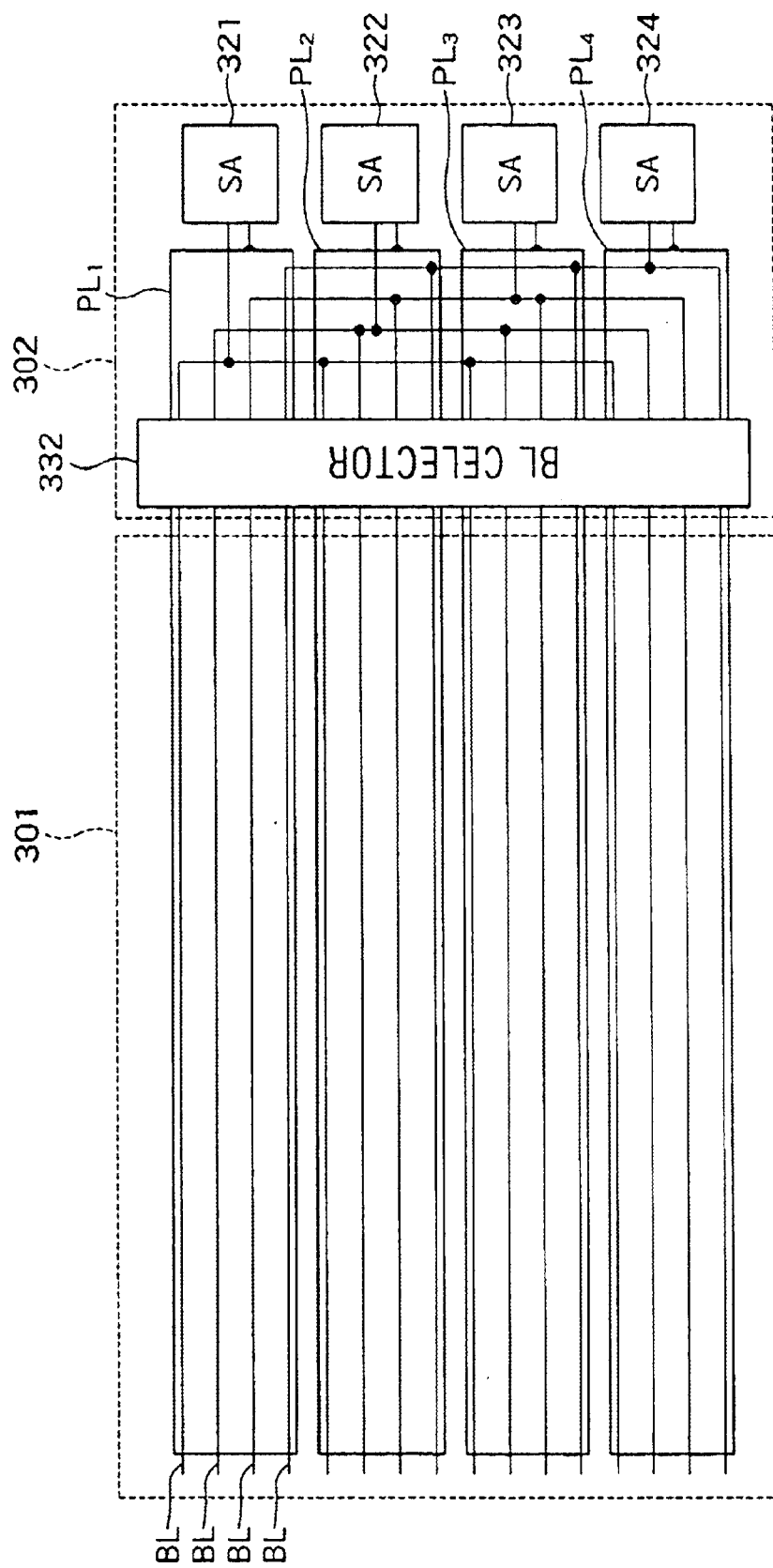
FIG. 10 is a diagram showing the layout and connection of sense amplifiers of the DRAM 300.

FIG. 10 is a diagram showing the layout and connection of sense amplifiers of the DRAM 300. The DRAM 300 includes memory cell arrays 301 and SA/PD 302. Word lines and memory cells are omitted from illustration of FIG. 10.

The plate lines PL1~PL4 are connected to sense amplifier circuit 321~324, respectively. Four bit lines BL associated with one plate line PL1 are connected to the sense amplifier circuits 321~324, respectively. Similarly, four bit lines associated with another plate line PL2 are connected to the sense amplifiers 321~324, four bit lines associated with still another plate line PL3 are connected to the sense amplifier circuit 321~324, and four bit lines associated with yet another plate lines PL4 are connected to the sense amplifier circuits 321~324.

Inside the DRAM 300, memory cells arrays 301 each including a number of memory cells are aligned side-by-side. The SA/PD 302 involves the sense amplifiers 321~324 and a BL selector 332. The sense amplifier circuit 321~324 include plate drivers. Positional relation of the memory cell arrays 301 and SA/PD 302 is the same as that of the memory cell arrays 10 and SA/PD 20 shown in FIG. 1. That is, SA/PDs circuits 302 are provided in every other spaces between adjacent memory cell arrays 301. Therefore, one SA/PD 302 is connected to two memory cell arrays 301 at both sides thereof.

The BL selector 332 randomly selects four bit lines associated with the plate lines PL1~PL4 respectively. Thereby, the sense amplifiers 321~324 can read and latch data in all memory cells. The plate lines PL1~PL4 are driven by one of the sense amplifier circuits 321~324 corresponding to the selected group of bit lines BL when data "0" is written in a memory cell. Therefore, the embodiment doe not need a circuit for selecting plate lines PL (PL selector).

(Fourth Embodiment)

Figure 11:
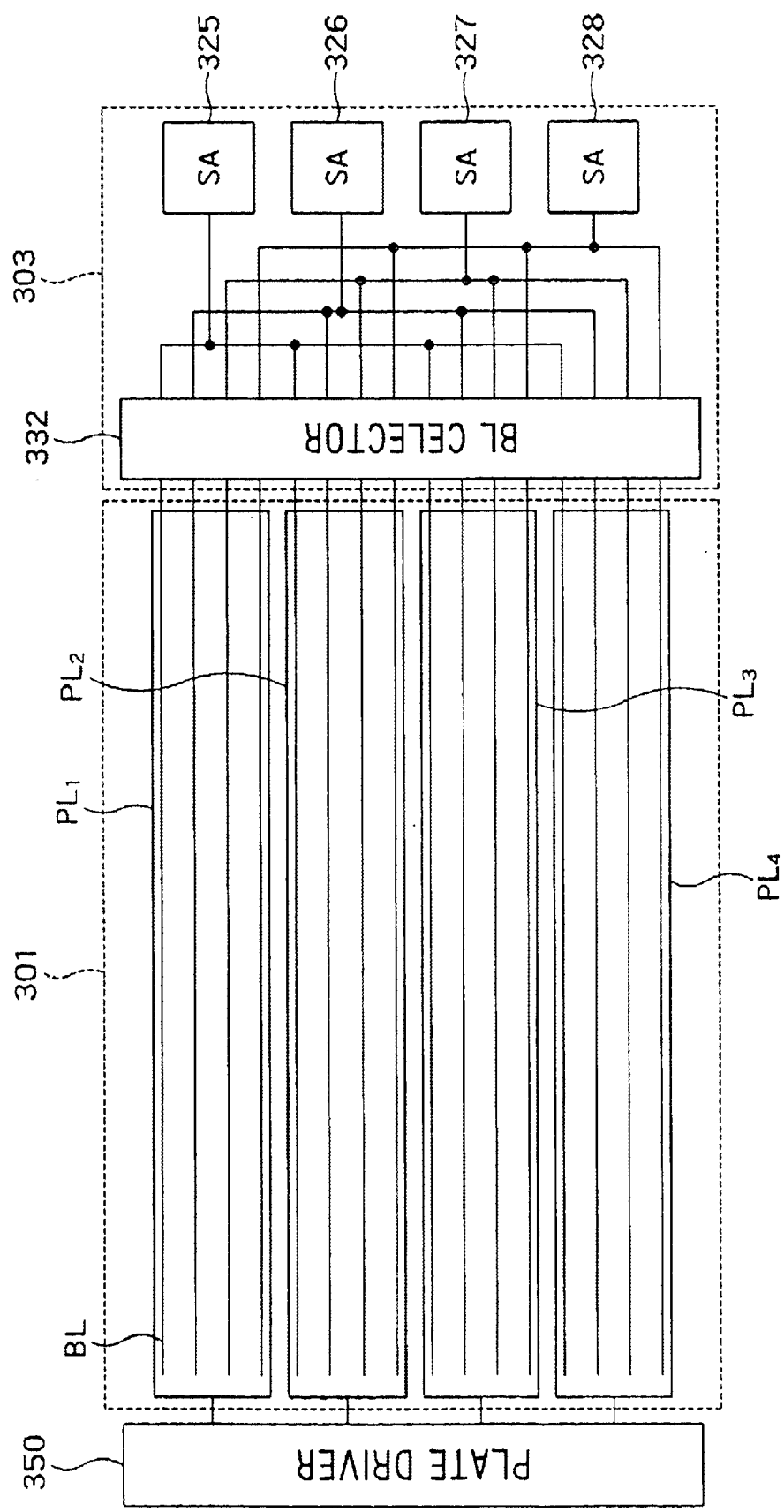
FIG. 11 is a diagram showing the layout and connection of sense amplifiers of the DRAM 400 according to the fourth embodiment of the invention.

FIG. 11 is a diagram showing the layout and connection of sense amplifiers of the DRAM 400 according to the fourth embodiment of the invention. The DRAM 400 includes memory cell arrays 301, sense amplifier portions 303 and plate driver portions 350. This embodiment is different from the third embodiment in including the plate driver portions 350 independently from the sense amplifier portions 303. Each sense amplifier portions 303 includes sense amplifiers 325~328 and a BL selector 332. The sense amplifiers 325~328 are those excluding plate drivers from the sense amplifiers 321~325 shown in FIG. 10. This embodiment includes plate drivers in form of the plate driver portion 350.

Positional relation of the memory cell arrays 301, sense amplifier portions 303 and plate driver portions 350 is the same as that of the sense amplifier portions 26 and plate driver portions 28 shown in FIG. 7. That is, each sense amplifier portion 303 is located near one side of a particular memory cell array 301. Each plate driver portion 350 is located near the opposite side of the memory cell array 301 to be opposed to the sense amplifier portion 303 via the same memory cell array 301. As such, the sense amplifier portions 303 and the plate driver portions 350 are provided to appear alternately in spaces between every two adjacent memory cell arrays 10, and they each are commonly used for two memory cell arrays 301 at both sides thereof.

This embodiment operates in the same manner as the third embodiment and ensures the same effects. Additionally, this embodiment makes it easier to design the sense amplifier portion 303 and the plate driver portion 350 because they are separately positioned. Especially when the bit lines BL and the plate lines PL are arranged in a fine pitch, it is difficult from the standpoint of the circuit design to drive the bit lines BL and the plate lines PL independently from the same direction. Therefore, the second embodiment is particularly effective for a design having a fine pitch arrangement of bit lines BL and plate lines PL.

What is claimed is:

1. A semiconductor integrated circuit device comprising:
   a semiconductor substrate;
   an insulating layer formed on the semiconductor substrate;
   a semiconductor layer insulated from the semiconductor substrate by the insulating layer;
   source regions of a first conduction type and drain regions of the first conduction type both formed in the semiconductor layer;
   body regions of a second conduction type formed in the semiconductor layer between the source regions and the drain regions to store data by accumulating or releasing an electric charge;
   word lines formed on the body regions in electrical isolation from the body regions to extend in a first direction;
   bit lines connected to the drain regions and extending in a direction different from the first direction; and
   buried wirings formed in the insulating layer in electrical isolation from the semiconductor substrate and the semiconductor layer, said buried wirings extending in parallel with the bit lines.

2. A semiconductor integrated circuit device according to claim 1, wherein a plurality of said bit lines extend in equal intervals and said buried wirings equal in number as the bit lines, and extend in the same intervals as those of the bit lines.

3. A semiconductor integrated circuit device according to claim 1, wherein the buried wirings extend in a direction across the word lines.

4. A semiconductor integrated circuit device according to claim 1, wherein the potential of a first word line of said word lines and the potential of a first buried layer of said buried wirings are driven in the same potential direction to release the electric charge from one body region located at an intersection of the first word line and the first buried wiring.

5. A semiconductor integrated circuit device according to claim 1 further comprising:
   a memory cell array including a plurality of said body regions located at intersections of the word lines and the bit lines;
   a detector circuit located near a first side of the memory cell array to detect data in the body regions of the memory cell array; and
   a drive circuit located near the fist side of the memory cell array to drive the buried wirings.

6. A semiconductor integrated circuit device according to claim 2 further comprising:
   a memory cell array including a plurality of said body regions located at intersections of the word lines and the bit lines;

a detector circuit located near a first side of the memory cell array to detect data in the body regions of the memory cell array; and a drive circuit located near the first side of the memory cell array to drive the buried wirings.

7. A semiconductor integrated circuit device according to claim 1 further comprising:

a memory cell array including a plurality of said body regions located at intersections of the word lines and the bit lines;

a detector circuit located near a first side of the memory cell array to detect data in the body regions of the memory cell array; and a drive circuit located near a second side of the memory cell array opposite from the first side thereof to drive the buried wirings.

8. A semiconductor integrated circuit device according to claim 2 further comprising:

a memory cell array including a plurality of said body regions located at intersections of the word lines and the bit lines;

a detector circuit located near a first side of the memory cell array to detect data in the body regions of the memory cell array; and a drive circuit located near a second side of the memory cell array opposite from the first side thereof to drive the buried wirings.

9. A semiconductor integrated circuit device according to claim 7, wherein a plurality of said memory cell arrays are provided in alignment, and a plurality of detector circuits and the drive circuits are provided alternately in spaces between adjacent said memory cells.

10. A semiconductor integrated circuit device according to claim 8, wherein a plurality of said memory cell arrays are provided in alignment, and a plurality of detector circuits and the drive circuits are provided alternately in spaces between adjacent said memory cells.

11. A semiconductor integrated circuit device according to claim 1, wherein each said buried layer is associated with a plurality of said bit lines.

12. A semiconductor integrated circuit device according to claim 2, wherein each said buried layer is associated with a plurality of said bit lines.

13. A semiconductor integrated circuit device according to claim 1, wherein each said body region constitutes a part of a full depression type memory cell.

* * * * *